(12) United States Patent
Bao et al.

(10) Patent No.: US 12,506,035 B2
(45) Date of Patent: Dec. 23, 2025

(54) SELF-ALIGNED SOURCE/DRAIN CONTACT STRUCTURE AND METHOD OF MANUFACTURING THE SAME

(71) Applicant: QUALCOMM Incorporated, San Diego, CA (US)

(72) Inventors: Junjing Bao, San Diego, CA (US); Haining Yang, San Diego, CA (US); Hyunwoo Park, San Diego, CA (US); Kwanyong Lim, San Diego, CA (US); Ming-Huei Lin, New Taipei (TW)

(73) Assignee: QUALCOMM Incorporated, San Diego, CA (US)

( * ) Notice: Subject to any disclaimer, the term of this patent is extended or adjusted under 35 U.S.C. 154(b) by 505 days.

(21) Appl. No.: 18/166,403

(22) Filed: Feb. 8, 2023

(65) Prior Publication Data

US 2024/0266217 A1 Aug. 8, 2024

(51) Int. Cl.
*H01L 21/768* (2006.01)
*H01L 21/321* (2006.01)
(Continued)

(52) U.S. Cl.
CPC .... *H01L 21/76897* (2013.01); *H01L 21/3212* (2013.01); *H01L 21/76829* (2013.01);
(Continued)

(58) Field of Classification Search
CPC ........... H10D 30/6219; H10D 30/6729; H10D 64/251–259; H10D 84/0149; H10D 84/0186; H10D 84/0147; H10D 84/0184; H10D 64/021; H10D 64/015; H10D 64/675; H01L 21/823475; H01L 21/823871; H01L 21/76885; H01L 21/76895; H01L 21/76897; H01L 21/76804; H01L 21/76805; H01L 21/76816;
(Continued)

(56) References Cited

U.S. PATENT DOCUMENTS 6,380,042 B1 *   4/2002   Huang ............... H10D 84/0147
                                              257/E21.507
9,349,833 B1 *   5/2016   Hung .................. H10D 64/017
(Continued)

OTHER PUBLICATIONS

International Search Report and Written Opinion—PCT/US2024/010454—ISA/EPO—May 21, 2024.

*Primary Examiner* — Younes Boulghassoul
(74) *Attorney, Agent, or Firm* — Geissier, Olds & Lowe, P.C./Qualcomm Incorporated

(57) ABSTRACT

Disclosed are techniques for a semiconductor structure. In an aspect, a semiconductor structure includes a gate structure disposed on a substrate, a gate spacer adjacent to the gate structure, a source/drain structure adjacent to the gate spacer, a first dielectric layer disposed on the substrate and the source/drain structure, an etch stop spacer over the first dielectric layer and adjacent to the gate spacer, and an etch stop layer over the gate structure, the gate spacer, and the etch stop spacer. The semiconductor structure further includes a source/drain contact extending through the etch stop layer and the first dielectric layer and in contact with the source/drain structure, a sidewall of the source/drain contact adjoining a sidewall of the etch stop layer and a sidewall of the etch stop spacer.

30 Claims, 11 Drawing Sheets

(51) Int. Cl.
  *H10D 30/62* (2025.01)
  *H10D 64/01* (2025.01)
  *H10D 64/23* (2025.01)

(52) U.S. Cl.
  CPC ... *H01L 21/76832* (2013.01); *H10D 30/6219* (2025.01); *H10D 64/017* (2025.01); *H10D 64/021* (2025.01); *H10D 64/251* (2025.01)

(58) Field of Classification Search
  CPC .......... H01L 21/76877; H01L 23/5226; H01L 23/5283; H01L 23/5286; H01L 23/528; H01L 23/481; H01L 23/535; H01L 23/5384; H01L 23/5386; H01L 21/76829–76834; H01L 21/76831; H01L 2221/1063
  See application file for complete search history.

(56) References Cited

U.S. PATENT DOCUMENTS

| | | | | |
|---|---|---|---|---|
| 9,496,368 | B2 | 11/2016 | Alptekin et al. | |
| 9,735,251 | B2* | 8/2017 | Deng | H01L 21/31116 |
| 10,037,943 | B2* | 7/2018 | Zhao | H01L 21/0214 |
| 10,083,863 | B1* | 9/2018 | Hsieh | H01L 21/31116 |
| 10,283,412 | B2* | 5/2019 | Hsu | H01L 21/76805 |
| 2012/0267727 | A1* | 10/2012 | Ho | H01L 21/76897 |
| | | | | 257/411 |
| 2016/0049427 | A1* | 2/2016 | Zang | H01L 21/31111 |
| | | | | 438/666 |
| 2016/0064327 | A1* | 3/2016 | Lin | H01L 21/76816 |
| | | | | 257/770 |
| 2016/0064516 | A1* | 3/2016 | Lee | H10D 62/021 |
| | | | | 257/288 |
| 2016/0181392 | A1* | 6/2016 | Alptekin | H01L 21/283 |
| | | | | 257/288 |
| 2016/0307758 | A1* | 10/2016 | Li | H01L 21/0217 |
| 2018/0151678 | A1* | 5/2018 | Li | H01L 21/28512 |
| 2019/0334008 | A1* | 10/2019 | Chen | H10D 30/024 |
| 2020/0027979 | A1* | 1/2020 | Zang | H10D 84/038 |
| 2020/0075401 | A1* | 3/2020 | Hsieh | H10D 62/832 |
| 2020/0105577 | A1* | 4/2020 | Liang | H10D 30/62 |
| 2020/0126857 | A1* | 4/2020 | Tsai | H01L 21/76834 |
| 2020/0303247 | A1* | 9/2020 | Shu | H01L 21/76837 |
| 2021/0020757 | A1* | 1/2021 | Yang | H01L 21/76844 |
| 2021/0098376 | A1* | 4/2021 | Lin | H01L 23/535 |
| 2021/0226030 | A1* | 7/2021 | Min | H10D 84/0147 |
| 2022/0216328 | A1* | 7/2022 | Suh | H10D 30/024 |
| 2022/0223422 | A1* | 7/2022 | Chou | H10D 64/017 |
| 2022/0336269 | A1* | 10/2022 | Tseng | H01L 21/76808 |
| 2023/0009977 | A1* | 1/2023 | Bao | H10D 84/038 |
| 2023/0044771 | A1* | 2/2023 | Ho | H10D 84/038 |
| 2023/0163075 | A1* | 5/2023 | Lin | H01L 21/76895 |
| | | | | 257/401 |
| 2023/0343854 | A1* | 10/2023 | Su | H10D 30/43 |
| 2024/0105775 | A1* | 3/2024 | Chiang | H10D 84/0158 |
| 2024/0128345 | A1* | 4/2024 | Xie | H10D 84/0149 |
| 2024/0153828 | A1* | 5/2024 | Liao | H10D 62/151 |
| 2024/0234545 | A1* | 7/2024 | Chen | H10D 64/017 |

\* cited by examiner

400

410 — Form an opening in an intermediate structure, wherein the intermediate structure includes: a substrate; a gate structure over the substrate; a gate spacer over the substrate and adjacent to a sidewall of the gate structure; a first conductive structure over the substrate and adjacent to the gate spacer; a first dielectric layer over the substrate and the first conductive structure; an etch stop spacer over the first dielectric layer and adjacent to the gate spacer; and an etch stop layer over and adjoining an upper surface of the gate structure, an upper surface of the gate spacer, and an upper surface of the etch stop spacer, wherein the opening extends through at least the etch stop layer and the first dielectric layer, and exposes the first conductive structure, and wherein a sidewall of the etch stop layer and a sidewall of the etch stop spacer defining at least a portion of a sidewall of the opening

420 — Form a second conductive structure in the opening, the second conductive structure extending through the etch stop layer and the first dielectric layer and in contact with the first conductive structure, and a sidewall of the second conductive structure adjoining the sidewall of the etch stop layer and the sidewall of the etch stop spacer

*FIG. 4*

SELF-ALIGNED SOURCE/DRAIN CONTACT STRUCTURE AND METHOD OF MANUFACTURING THE SAME

TECHNICAL FIELD

The present disclosure generally relates to semiconductor structures, and more particularly, to a semiconductor structure having a self-aligned small contact structure.

BACKGROUND

Integrated circuits (ICs) are becoming more prevalent in electronic devices. An IC may be implemented in the form of an IC die (or an IC chip, or simply a die or a chip) that has a set of electronic circuits integrated thereon. In some implementations, an IC die includes a semiconductor substrate, various electrical components (e.g., transistors, resistors, capacitors, and/or inductors) on the substrate, and various conductive structures connecting the electrical components to form the set of electronic circuits. The manufacturing processes for fabricating the electrical components may be collectively referred to as the front end of line (FEOL) process. The manufacturing processes for forming a portion of the conductive structures in the form of layers of conductive lines and via plugs may be collectively referred to as the back end of line (BEOL) process. In some applications, the processes for forming another portion of the conductive structures (including, e.g., contact plugs or sometimes simply referred to as contacts) that connects the electrical components and the layers of conductive lines and via plugs may be collectively referred to as the middle of line (MOL) process.

With the development of the manufacturing technology, the size of the MOL contacts shrinks together with the decrease of the component sizes. The MOL contacts with a reduced size may reduce parasitic effects, such as the contact-to-gate capacitance, for improved performance including reduced dynamic power consumption and improved DOU. In some applications, for forming a smaller contact (e.g., for a critical dimension (CD) of 15 nanometers (nm) or less), precise overlay and/or high dosage of exposure (e.g., high dosage of extreme ultraviolet (EUV) lithography) are normally used in order to avoid contact overlay misalignment or a contact-to-gate short, but at the cost of complicated processes, wafer reworks, and/or reduced wafer throughput.

Therefore, there is a need for an improved MOL process for forming a smaller contact that may be properly aligned to effectively avoid the contact-to-gate short without significantly increasing the processing complexity and/or decreasing the wafer throughput.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a semiconductor structure includes a gate structure disposed on a substrate; a gate spacer adjacent to a sidewall of the gate structure; a source/drain structure adjacent to the gate spacer; a first dielectric layer disposed on the substrate and the source/drain structure; an etch stop spacer over the first dielectric layer and adjacent to the gate spacer; an etch stop layer over and adjoining an upper surface of the gate structure, an upper surface of the gate spacer, and an upper surface of the etch stop spacer; and a source/drain contact extending through the etch stop layer and the first dielectric layer and in contact with the source/drain structure, a sidewall of the source/drain contact adjoining a sidewall of the etch stop layer and a sidewall of the etch stop spacer.

In an aspect, a method of manufacturing a semiconductor structure includes forming an opening in an intermediate structure, wherein the intermediate structure includes: a substrate; a gate structure disposed on the substrate; a gate spacer adjacent to a sidewall of the gate structure; a source/drain structure adjacent to the gate spacer; a first dielectric layer disposed on the substrate and the source/drain structure; an etch stop spacer over the first dielectric layer and adjacent to the gate spacer; and an etch stop layer over and adjoining an upper surface of the gate structure, an upper surface of the gate spacer, and an upper surface of the etch stop spacer, wherein the opening extends through at least the etch stop layer and the first dielectric layer, and exposes the source/drain structure, and wherein a sidewall of the etch stop layer and a sidewall of the etch stop spacer defining at least a portion of a sidewall of the opening; and forming a source/drain contact in the opening, the source/drain contact extending through the etch stop layer and the first dielectric layer and in contact with the source/drain structure, and a sidewall of the source/drain contact adjoining the sidewall of the etch stop layer and the sidewall of the etch stop spacer.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

FIG. 4 illustrates a method for manufacturing a semiconductor structure, according to aspects of the disclosure.

DETAILED DESCRIPTION

Figure 1:
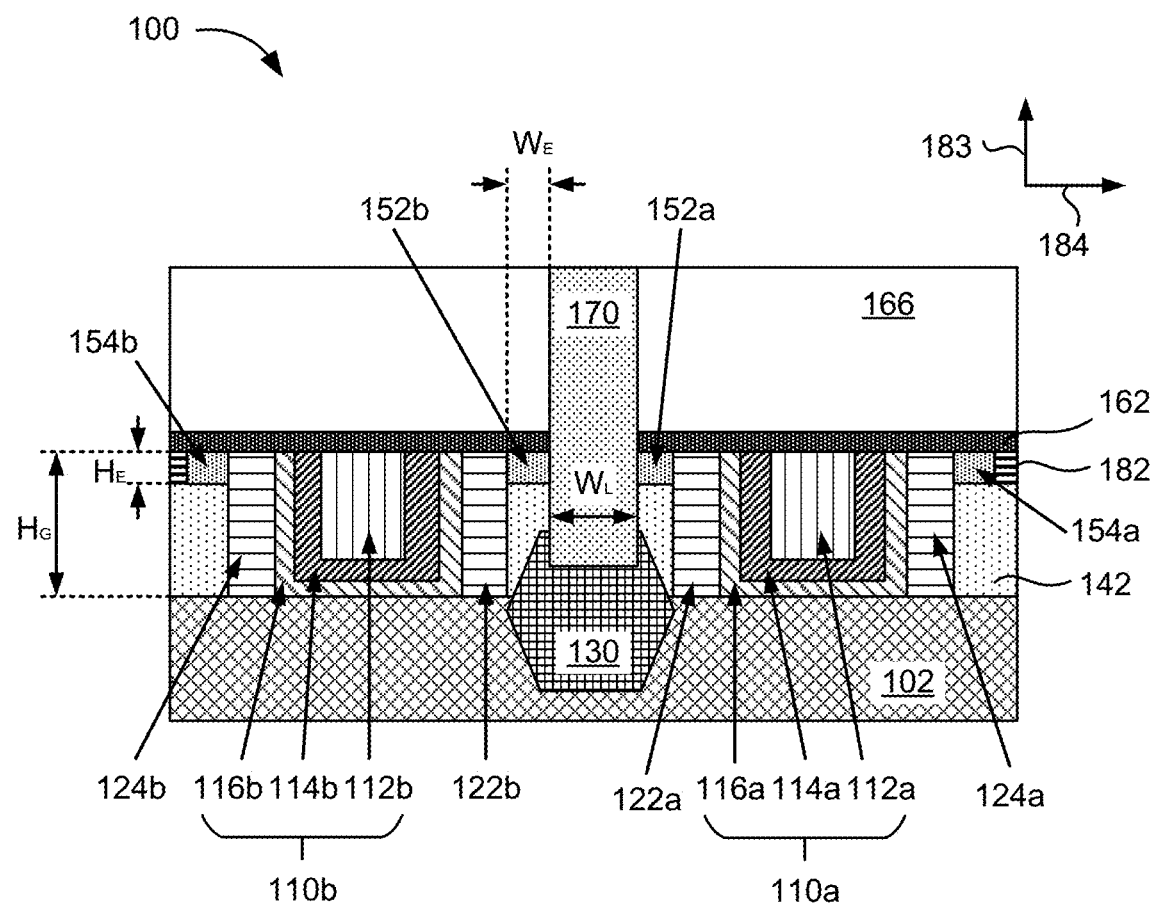
FIG. 1 illustrates an example semiconductor structure, according to aspects of the disclosure.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

According to the present application, the MOL process may include formation of etch stop spacers adjacent to gate spacers. The etch stop spacers may restrict the etching process for forming an opening for a plug contact. The etch stop spacers allow the formation of the plug contact to be "self-aligned," such that the plug contact may reach a desirable critical dimension (CD) and may be kept sufficiently away from the nearby gate structure for a lower parasitic capacitance and for avoidance of the contact-to-gate short. Therefore, the precision requirement for the patterning process for the opening and/or the complexity of the MOL process may be relaxed.

FIG. 1 illustrates an example semiconductor structure 100, according to aspects of the disclosure. In some aspects, the semiconductor structure 100 corresponds to a portion of a die at an intermediate stage during a MOL process.

As shown in FIG. 1, the semiconductor structure 100 includes a substrate 102, a gate structure 110a and a gate structure 110b disposed on the substrate 102, a gate spacer 122a over the substrate 102 and adjacent to a sidewall of the gate structure 110a, a gate spacer 124a over the substrate 102 and adjacent to another sidewall of the gate structure 110a, a gate spacer 122b over the substrate 102 and adjacent to a sidewall of the gate structure 110b, and a gate spacer 124b over the substrate 102 and adjacent to another sidewall of the gate structure 110b. The semiconductor structure 100 includes a source/drain structure 130 over the substrate and adjacent to the gate spacer 122a and the gate spacer 122b. Also, the semiconductor structure 100 includes a first dielectric layer 142 disposed on the substrate and the source/drain structure 130.

In some aspects, the substrate may be an undoped silicon substrate (e.g., with silicon purity of at least 99.9999999 wt %, nine-nines, or 9N), a doped silicon substrate, a III-V substrate (e.g., based on gallium arsenide (GaAs) or indium phosphorus (InP)), a sapphire substrate, or any substrate on which semiconductor components may be formed. In some aspects, the first dielectric layer 142 may have a relative dielectric constant not greater than that of silicon dioxide ($SiO_2$). In some aspects, the first dielectric layer 142 may include SiCOH or $SiO_2$. In some aspects, the gate spacers 122a, 122b, 124a, and 124b may have a relative dielectric constant not greater than that of $SiO_2$. In some aspects, the gate spacers 122a, 122b, 124a, and 124b may include SiBCN. In some aspects, the source/drain structure 130 may include epitaxial silicon or epitaxial polysilicon.

In some aspects, the gate structure 110a is a gate of a first transistor, and the source/drain structure 130 may form a source or drain terminal of the first transistor. In some aspects, the gate structure 110b is a gate of a second transistor, and the source/drain structure 130 may form a source or drain terminal of the second transistor. In some aspects, a height $H_G$ (measurable along a vertical direction 183) of the gate structure 110a and 110b may range from 10 nm to 20 nm.

In some aspects, the gate structure 110a may be a high-k metal gate. In some aspects, the gate structure 110a may include a conductive structure 112a, a gate metal layer 114a adjoining side walls and a bottom surface of the conductive structure 112a, and a gate dielectric layer 116a adjoining side walls and a bottom surface of the gate metal layer 114a. The gate metal layer 114a may be sandwiched by the gate dielectric layer 116a and the conductive structure 112a. In some aspects, the gate dielectric layer 116a may have a relative dielectric constant greater than that of that of $SiO_2$. In some aspects, the conductive structure 112a may include tungsten, copper, or silicide. In some aspects, the gate metal layer 114a may include TiAlN, TiAl, TiN, or any materials for suitable work function settings. In some aspects, the gate dielectric layer 116a may include $HfO_2$.

In some aspects, the gate structure 110b may be a high-k metal gate. In some aspects, the gate structure 110b may include a conductive structure 112b, a gate metal layer 114b adjoining side walls and a bottom surface of the conductive structure 112b, and a gate dielectric layer 116b adjoining side walls and a bottom surface of the gate metal layer 114b. The gate metal layer 114b may be sandwiched by the gate dielectric layer 116b and the conductive structure 112b. In some aspects, the gate dielectric layer 116b may have a relative dielectric constant greater than that of that of $SiO_2$. In some aspects, the conductive structure 112b may include tungsten, copper, or silicide. In some aspects, the gate metal layer 114b may include TiAlN, TiAl, TiN, or any materials for suitable work function settings. In some aspects, the gate dielectric layer 116b may include $HfO_2$.

As shown in FIG. 1, the gate structure 110a and the gate structure 110b may be gate-last high-k metal gates. In some aspects, any one of the gate structure 110a or the gate structure 110b may be a gate-first high-k metal gate, a polysilicon gate, or a metal gate.

The semiconductor structure 100 further includes etch stop spacers 152a, 154a, 152b, and 154b over the first dielectric layer 142. The etch stop spacer 152a is adjacent to the gate spacer 122a; the etch stop spacer 154a is adjacent to the gate spacer 124a; the etch stop spacer 152b is adjacent to the gate spacer 122b; and the etch stop spacer 154b is adjacent to the gate spacer 124b. The semiconductor structure 100 includes an etch stop layer 162 over and adjoining an upper surface of the gate structure 110a, an upper surface of the gate structure 110b, upper surfaces of the gate spacers 122a, 122b, 124a, and 124b, and upper surface of the etch stop spacers 152a, 152b, 154a, and 154b. Also, the semiconductor structure 100 includes a source/drain contact 170 extending through the etch stop layer 162 and the first dielectric layer 142. The source/drain contact 170 is in contact with the source/drain structure 130, where a sidewall of the source/drain contact 170 may adjoin a sidewall of the etch stop layer 162 and a sidewall of the etch stop spacer 152a, and another sidewall of the source/drain contact 170 may adjoin another sidewall of the etch stop layer 162 and a sidewall of the etch stop spacer 152b. In some aspects, a width (measurable along a horizontal direction 184) of a portion of the first dielectric layer 142 between a lower portion of the source/drain contact 170 and the gate spacers 122a and 122b is greater than zero.

In some aspects, the etch stop spacers 152a, 152b, 154a, and 154b may include a material that has a sufficient selectivity towards the first dielectric layer 142 during an etching process (e.g., the first dielectric layer 142 being removed faster than the etch stop spacers 152a, 152b, 154a, and 154b). In some aspects, the etch stop spacers 152a, 152b, 154a, and 154b may include silicon nitride, aluminum oxide, aluminum nitride, or a combination thereof. In some aspects, the source/drain contact 170 may include cobalt, tungsten, or both. In some aspects, a height $H_E$ (measurable along the vertical direction 183) of the etch stop spacers 152a, 152b, 154a, and 154b may range from 1 nm to 5 nm. In some aspects, a width $W_E$ (measurable along the horizontal direction 184) of the etch stop spacer 152a or 152b may range from 1 nm to 5 nm. In some aspects, a width $W_L$ (measurable along the horizontal direction 184) of a lower portion of the source/drain contact 170 below the etch stop spacers 152a, 152b, 154a, and 154b may range from 5 nm to 15 nm.

In some aspects, the semiconductor structure 100 may include a second dielectric layer 182 over the first dielectric layer 142, where the etch stop layer 162 may be over and adjoining an upper surface of the second dielectric layer 182. In some aspects, the semiconductor structure 100 may include a third dielectric layer 166 over the etch stop layer 162, where the source/drain contact 170 may extend through the third dielectric layer 166.

In some aspects, the second dielectric layer 182 may include SiCOH or $SiO_2$. In some aspects, the third dielectric layer 166 may include $SiO_2$. In some aspects, the etch stop layer 162 may include a material that has a sufficient selectivity towards at least the third dielectric layer 166 during one or more etching processes (e.g., the third dielectric layer 166 being removed faster than the etch stop layer 162 in one etching process and/or the etch stop layer 162 being removed faster than the third dielectric layer 166 in another etching process). In some aspects, the etch stop layer 162 may include silicon nitride, silicon carbide, or a combination thereof.

In view of the above, the position and the size of the source/drain contact 170 may be determined primarily by the etch stop spacers 152a and 152b rather than the mask(s) used for forming the contact opening (in which the source/drain contact 170 is formed) in the MOL process or the alignment of the masks for the MOL process. Therefore, in some aspects, the source/drain contact 170 may also be referred to as a "self-aligned contact." In some aspects, a source/drain contact may be referred to as a "small contact" in a case that the source/drain contact and the corresponding gate spacer are separated by a piece of dielectric material (e.g., a portion of the first dielectric layer 142). Therefore, in some aspects, the source/drain contact 170 may also be referred to as a "self-aligned small contact." In some aspects, the smaller contact size may result in a lower contact-to-gate capacitance.

In some aspects, the etch stop spacer 152a and 152b may have a same width (measurable along the horizontal direction 184) due to conformal deposition and anisotropic etch for forming the etch stop spacer 152a and 152b. In some aspects, the gate spacers 122a and 122b may have a same width (measurable along the horizontal direction 184) also due to conformal deposition and anisotropic etch for forming the gate spacer s122a and 122b. Therefore, in some aspects, the source/drain contact 170 may have an identical distance to the gate structures 110a and 110b. In some aspects, the self-alignment feature of the source/drain contact 170 may minimize the contact-to-gate capacitance as well as mitigate contact-to-gate short from misalignment.

In some aspects, even under possible process variations or a certain level of misalignment of masks for the lithography processes, the one or more etching processes for forming an opening for the source/drain contact 170 may be restricted by the etch stop spacers 152a and 152b, and a lower portion of the source/drain contact 170 may thus be kept sufficiently small (e.g., the CD<15 nm) and sufficiently away from the gate structures 110a and 110b. Accordingly, the chance of forming a contact-to-gate short between the source/drain contact 170 and the gate structures 110a and 110b may be reduced. Also, the parasitic capacitance between the source/drain contact 170 and the gate structures 110a and 110b may be within a predetermined range, as the distances between and the source/drain contact 170 and the gate structures 110a and 110b may be restricted by the etch stop spacers 152a and 152b.

In some aspects, as the position and the size of the source/drain contact 170 may be determined primarily by the etch stop spacers 152a and 152b, the size of the opening above the etch stop spacers 152a and 152b for the source/drain contact 170 may be set to be larger than the desirable width of the source/drain contact 170 below the etch stop spacers 152a and 152b. Also, in some aspects, the precision of the alignment of the mask for the opening above the etch stop spacers 152a and 152b for the source/drain contact 170 may be relaxed (e.g., more tolerant to mask misalignment). Accordingly, the performance of the resulting IC may be reached while the complexity of manufacturing processes may be reduced, the number of masks needed may be reduced, the throughput may be increased, the yield rate may be increased, and/or the manufacturing cost may be reduced.

Figure 2A:
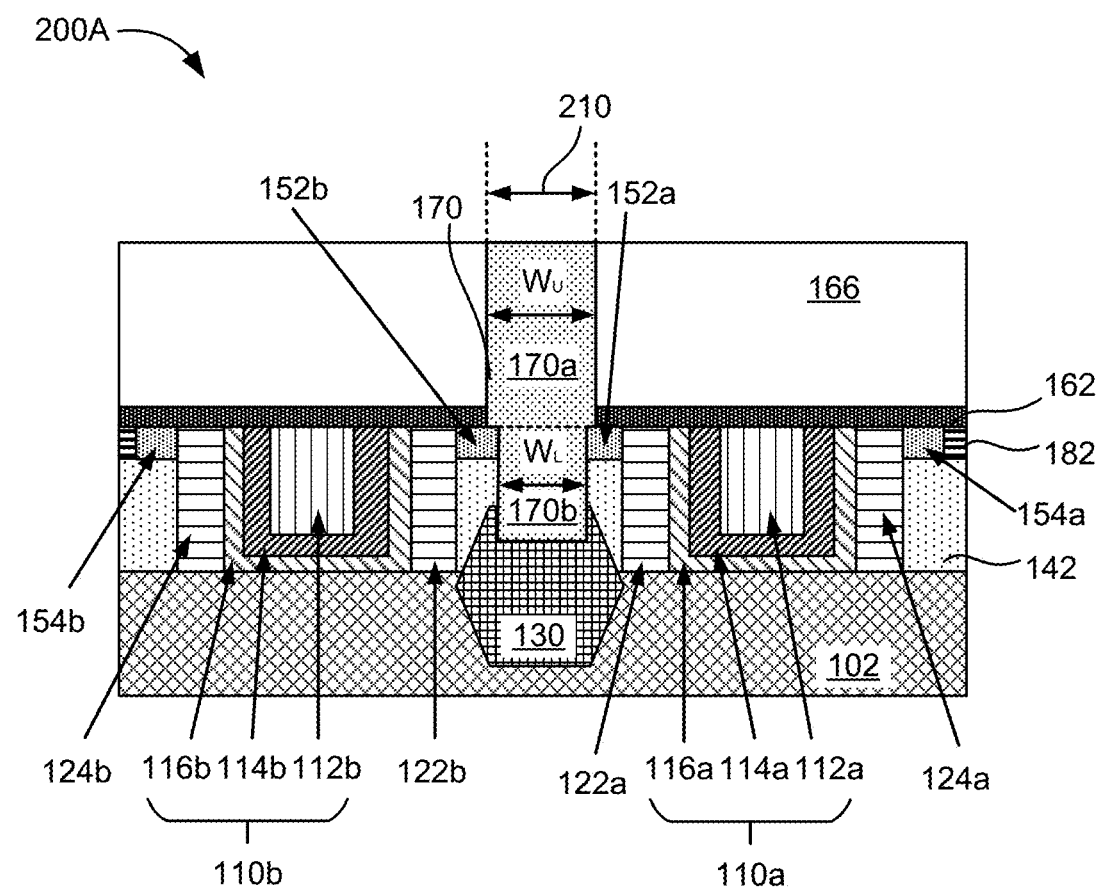
FIGS. 2A-2C illustrate example semiconductor structures fabricated under various tolerable conditions, according to aspects of the disclosure.

FIG. 2A illustrates an example semiconductor structure 200A fabricated under a first tolerable condition, according to aspects of the disclosure. The components of the semiconductor structure 200A that are the same or similar to those of the semiconductor structure 100 are given the same reference numbers, and the detailed description thereof may be omitted.

As shown in the FIG. 2A, the source/drain contact 170 may include an upper portion 170a above the etch stop spacers 152a and 152b and a lower portion 170b below the etch stop spacers 152a and 152b. In some aspects, the first tolerable condition corresponds to the patterning process for forming an opening for the source/drain contact 170 may be performed based on a mask corresponding a width of the opening greater than a desirable width of the lower portion 170b of the source/drain contact 170. The position and width of the lower portion of the opening for the lower portion 170b of the source/drain contact 170 may be further restricted by the etch stop spacers 152a and 152b.

For example, in some aspects, in a case that such mask is properly aligned with a predetermined opening position 210, the resulting source/drain contact 170 may have a T shape. In some aspects, a width $W_L$ of the lower portion 170b of the source/drain contact 170b may be no greater than a width $W_U$ of the upper portion 170a of the source/drain contact 170. In some aspects, the width $W_L$ of the lower portion 170b of the source/drain contact 170 may range from 5 nm to 15 nm, and the width $W_U$ of the upper portion 170a of the source/drain contact 170 may range from 10 nm to 20 nm.

According to the example of FIG. 2A, using a mask with a wider pattern for the opening (i.e., the first tolerable condition) may save the cost in various aspects including mask preparation, lithographic machine and process, and/or precision control of the etching process. In some aspects, the etch stop spacers 152a and 152b may ensure the position and size of the lower portion 170b of the source/drain contact 170 regardless of the size of the pattern in the mask for forming the opening (as reflected in the width of the upper portion 170a of the source/drain contact 170) being wider.

Figure 2B:
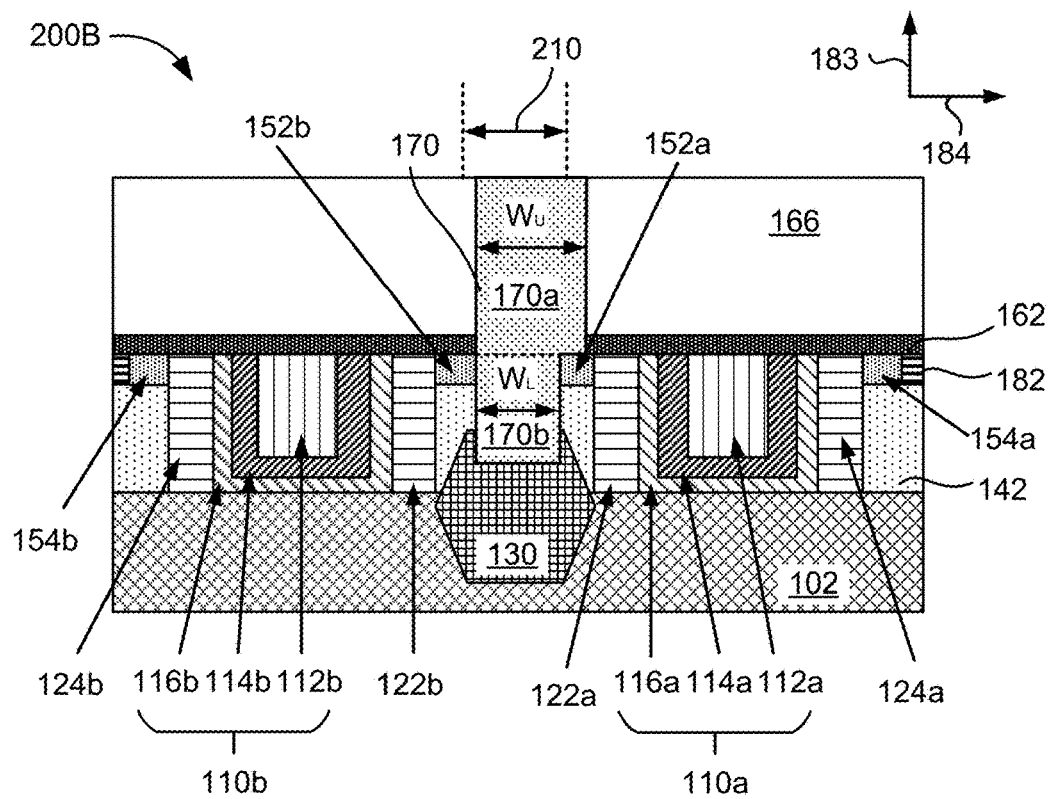

FIG. 2B illustrates an example semiconductor structure 200B fabricated under a second tolerable condition, according to aspects of the disclosure. The components of the semiconductor structure 200B that are the same or similar to those of the semiconductor structure 100 or 200A are given the same reference numbers, and the detailed description thereof may be omitted.

In some aspects, the second tolerable condition corresponds to the patterning process for forming an opening for the source/drain contact 170 may be performed based on a mask having a pattern corresponding a width of the opening greater than a desirable width of the lower portion 170b of the source/drain contact 170, and the alignment of the mask is shifted toward the direction of the gate structure 110a (e.g., along the horizontal direction 184).

Figure 2C:
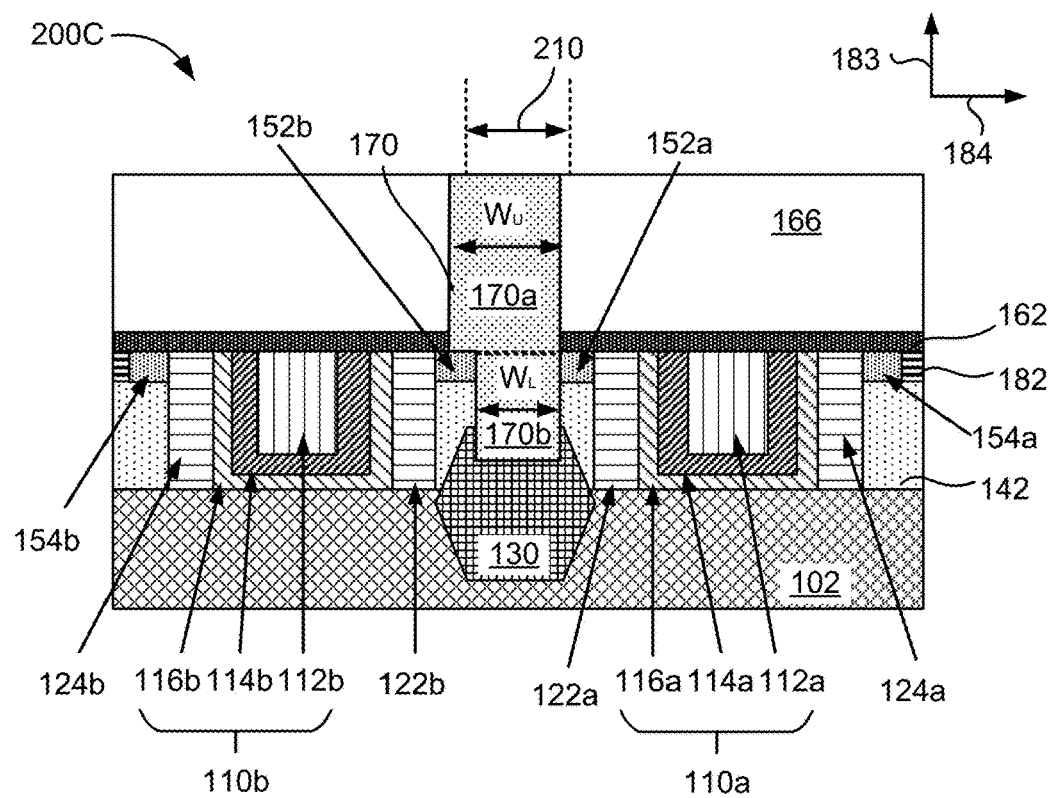

FIG. 2C illustrates an example semiconductor structure 200C fabricated under a third tolerable condition, according to aspects of the disclosure. The components of the semiconductor structure 200C that are the same or similar to those of the semiconductor structure 100 or 200A are given the same reference numbers, and the detailed description thereof may be omitted.

In some aspects, the third tolerable condition corresponds to the patterning process for forming an opening for the source/drain contact 170 may be performed based on a mask having a pattern corresponding a width of the opening greater than a desirable width of the lower portion 170b of the source/drain contact 170, and the alignment of the mask is shifted toward the direction of the gate structure 110b (e.g., along the horizontal direction 184).

As shown in FIGS. 2B and 2C, in some aspects, in a case that the mask for the opening is not aligned with the predetermined opening position 210, the resulting source/drain contact 170 may have an inverted L shape. The position and width of the lower portion of the opening for the lower portion 170b of the source/drain contact 170 may still be restricted by the etch stop spacers 152a and 152b.

According to the examples of FIGS. 2B and 2C, using a less precise lithographic machine and process may be compensated or remedied by the self-alignment provided by the etch stop spacers 152a and 152b. In some aspects, the etch stop spacers 152a and 152b may ensure the position and size of the lower portion 170b of the source/drain contact 170 regardless of the alignment of the mask for forming the opening being shifted.

FIGS. 3A-3J illustrate an example partial method for manufacturing a semiconductor structure (such as the semiconductor structure 100 in FIG. 1), according to aspects of the disclosure. The components illustrated in FIGS. 3A-3J that are the same or similar to those of the semiconductor structure 100 are given the same reference numbers, and the detailed description thereof may be omitted.

Figure 3A:
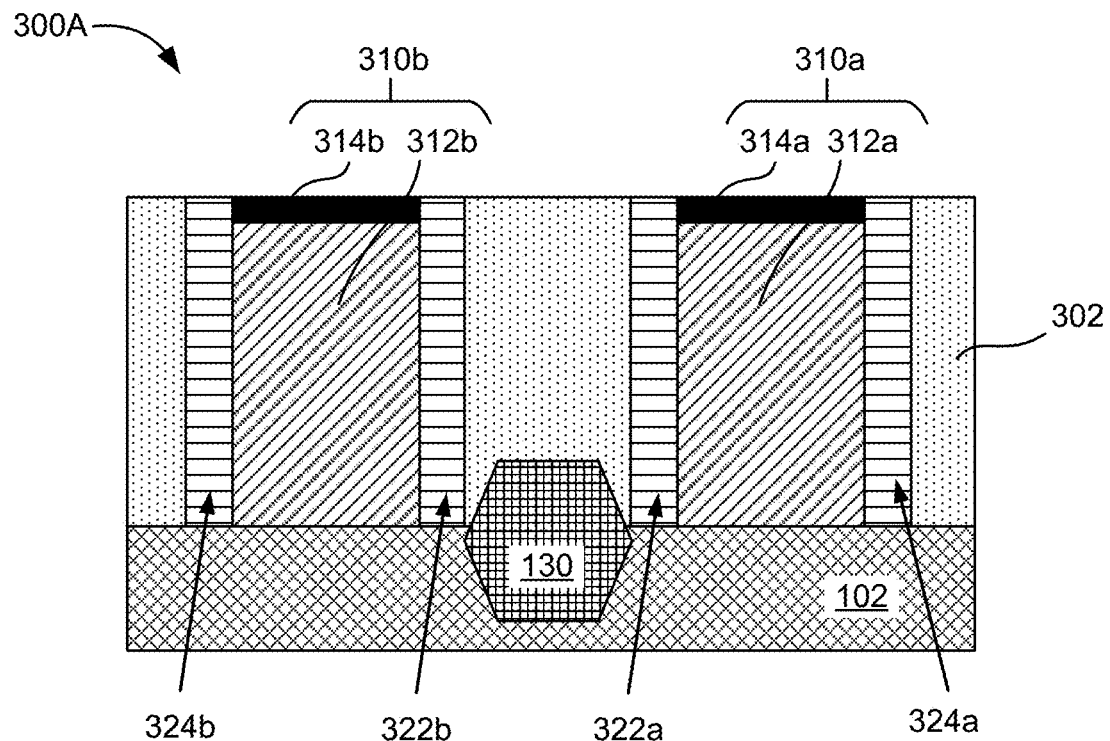
FIGS. 3A-3J illustrate an example partial method for manufacturing a semiconductor structure, according to aspects of the disclosure.

As shown in FIG. 3A, a semiconductor structure 300A is formed. The semiconductor structure 300A includes a substrate 102, a first layer of dielectric material 302 over the substrate 102, and an intermediate gate structure 310a and an intermediate gate structure 310b formed over the substrate 102. Layers of first spacer material 322a, 322b, 324a, and 324b are formed on sidewalls of the intermediate gate structure 310a and the intermediate gate structure 310b. The layers of first spacer material 322a and 324a and the intermediate gate structure 310a are surrounded by the first layer of dielectric material 302; and the layers of first spacer material 322b and 324b and the intermediate gate structure 310b are surrounded by the first layer of dielectric material 302.

In some aspects, the intermediate gate structure 310a may include a polysilicon gate 312a and a hard mask 314a over the polysilicon gate 312a. In some aspects, the intermediate gate structure 310b may include a polysilicon gate 312b and a hard mask 314b over the polysilicon gate 312b. In some aspects, the layers of first spacer material 322a, 322b, 324a, and 324b may be formed by deposition using chemical vapor deposition (CVD) or physical vapor deposition (PVD). In some aspects, the layers of first spacer material 322a, 322b, 324a, and 324b may have a relative dielectric constant not greater than that of $SiO_2$. In some aspects, the layers of first spacer material 322a, 322b, 324a, and 324b may include SiBCN.

In some aspects, a source/drain structure 130 may be formed over the substrate 102 and adjacent to the layers of first spacer material 322a, and 322b. In some aspects, the source/drain structure 130 may be formed based on an epitaxially growth process and may include epitaxial silicon or epitaxial polysilicon.

In some aspects, the first layer of dielectric material 302 may be formed by filling a dielectric material after formation of the intermediate gate structures 310a and 310b, the layers of first spacer material 322a, 322b, 324a, and 324b, and the source/drain structure 130. In some aspects, the first layer of dielectric material 302 may be formed by CVD or PVD. In some aspects, the first layer of dielectric material 302 may have a relative dielectric constant not greater than that of $SiO_2$. In some aspects, the first layer of dielectric material 302 may include SiCOH or $SiO_2$.

Figure 3B:
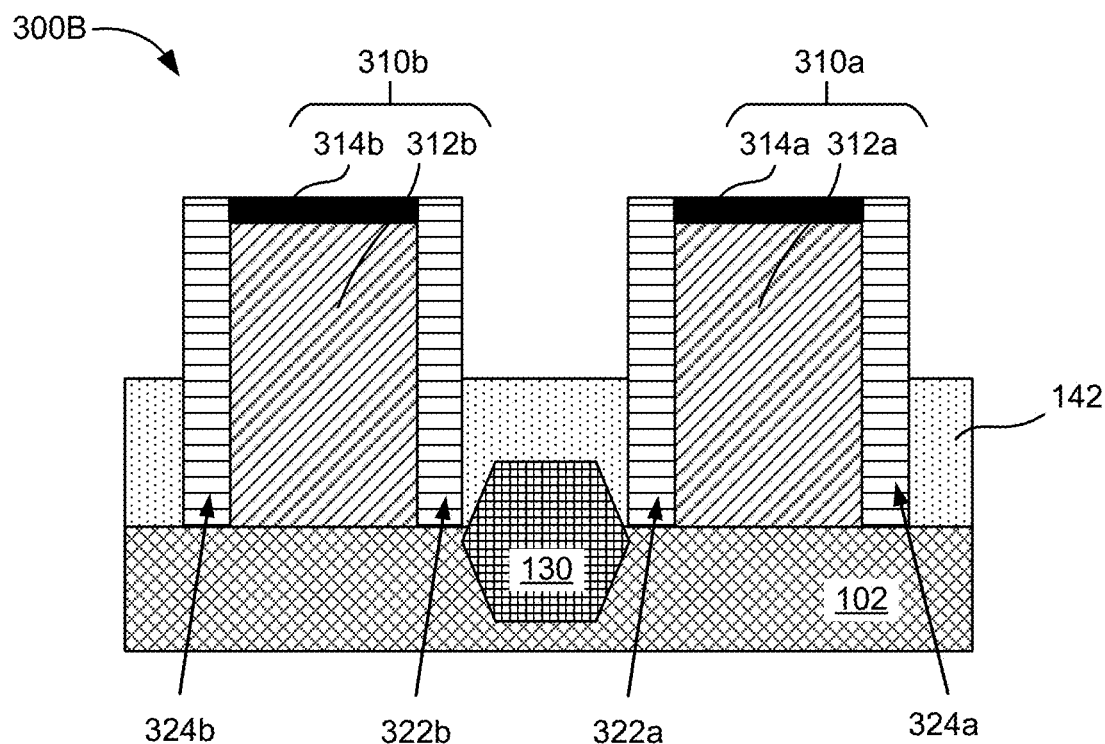

As shown in FIG. 3B, a semiconductor structure 300B is formed based on the semiconductor structure 300A, by removing an upper portion of the first layer of dielectric material 302 to become a first dielectric layer 142. In some aspects, the removal of the upper portion of the first layer of dielectric material 302 is performed by a recess process based on a wet etching process.

Figure 3C:
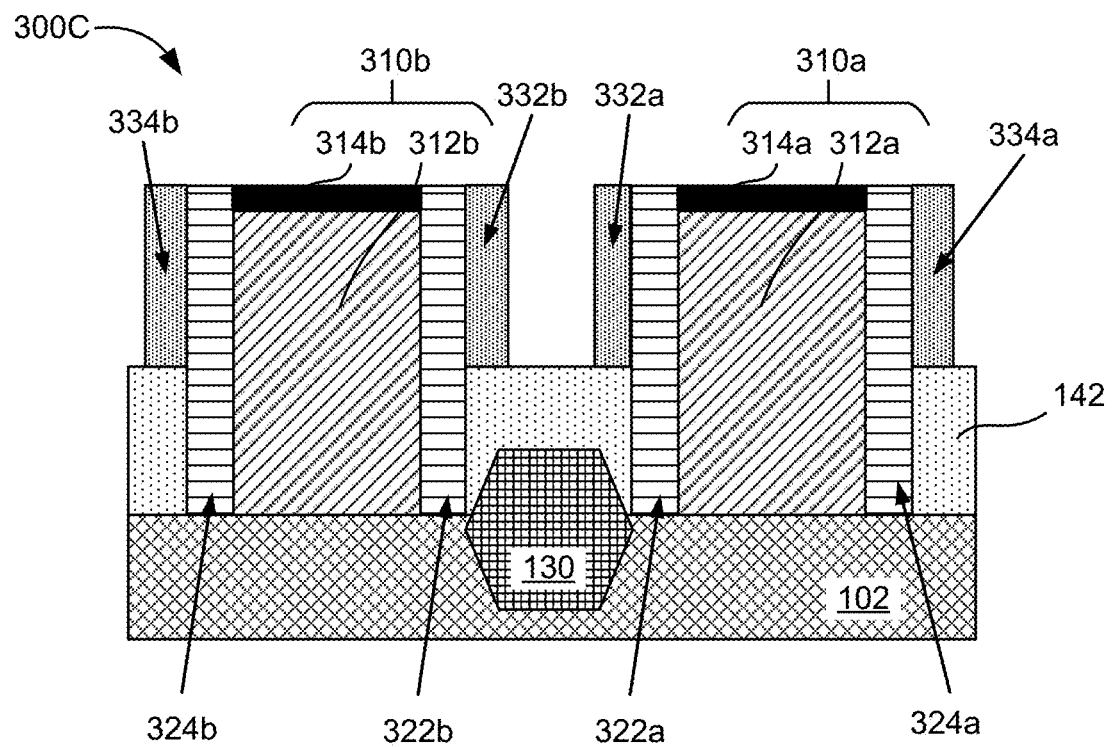

As shown in FIG. 3C, a semiconductor structure 300C is formed based on the semiconductor structure 300B, by forming layers of second spacer material 332a, 332b, 334a, and 334b on at least a portion of the respective sidewalls of the layers of first spacer material 322a, 322b, 324a, and 324b. The layers of second spacer material 332a, 332b, 334a, and 334b are over the first dielectric layer 142. In some aspects, the layers of second spacer material 332a, 332b, 334a, and 334b may be formed by deposition using CVD or PVD. In some aspects, the layers of second spacer material 332a, 332b, 334a, and 334b may include silicon nitride, aluminum oxide, aluminum nitride, or a combination thereof. In some aspects, a width of any of the layers of second spacer material 332a, 332b, 334a, and 334b may range from 1 nm to 5 nm.

Figure 3D:
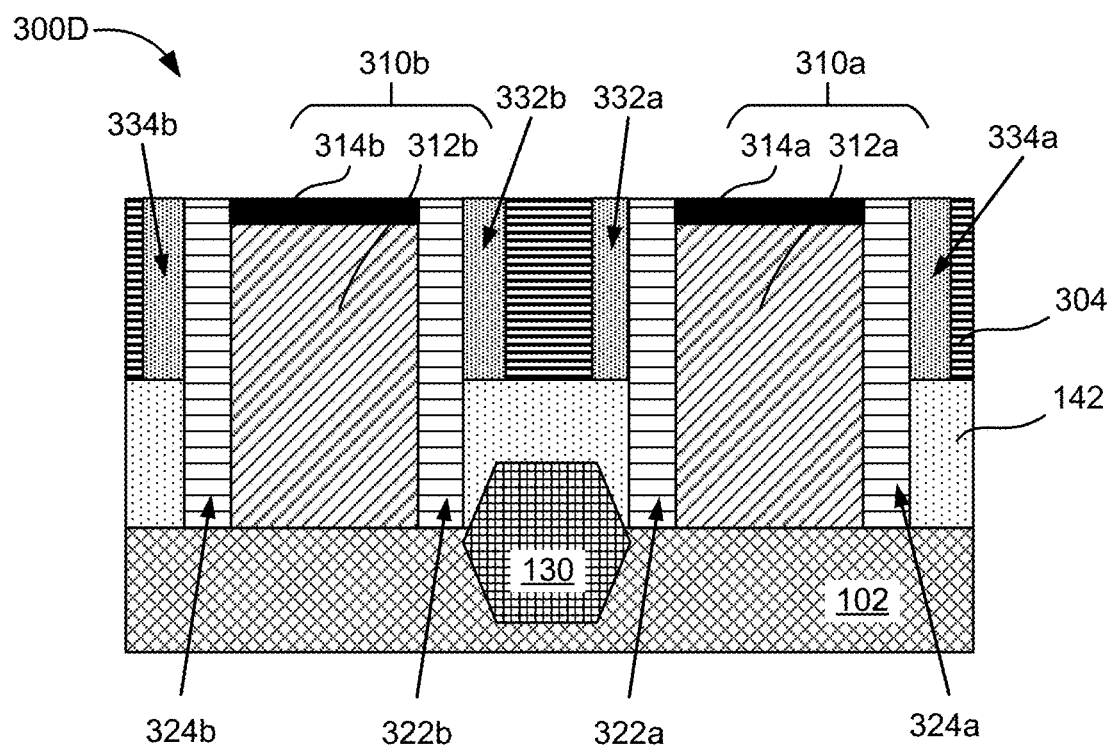

As shown in FIG. 3D, a semiconductor structure 300D is formed based on the semiconductor structure 300C, by forming a second layer of dielectric material 304 over the first dielectric layer 142. In some aspects, the second layer of dielectric material 304 is an intermediate dielectric layer to be at least partially removed in a later processing stage.

In some aspects, the layers of second spacer material 332a and 332b may be directly over a first portion of the source/drain structure 130. In some aspects, a portion of the second layer of dielectric material 304 may be adjacent to the sidewalls of the layers of second spacer material 332a and 332b and directly over a second portion of the source/drain structure 130.

In some aspects, the second layer of dielectric material 304 may be formed by filling a dielectric material to the recesses shown in the semiconductor structure 300C. In some aspects, the second layer of dielectric material 304 may be formed by CVD or PVD. In some aspects, the second layer of dielectric material 304 may include SiCOH or $SiO_2$.

Figure 3E:
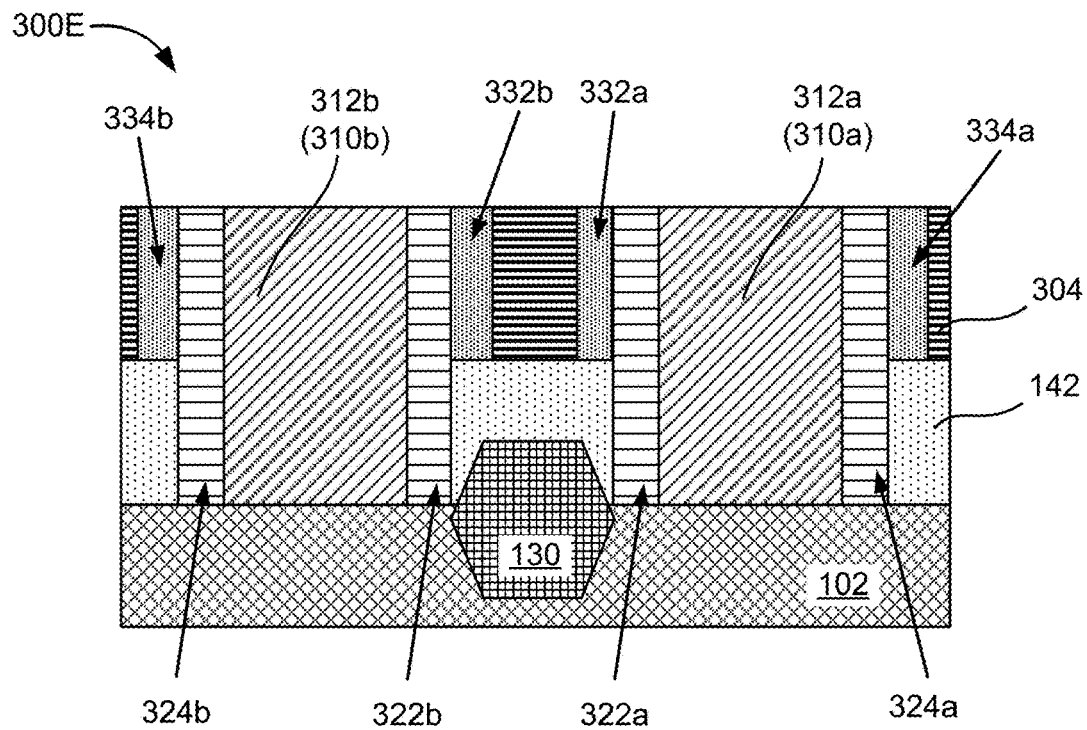

As shown in FIG. 3E, a semiconductor structure 300E is formed based on the semiconductor structure 300D, by removing a top portion of the semiconductor structure 300D in order to remove the hard mask 314a and the hard mask 314b. While the top portions of the intermediate gate structure 310a, the intermediate gate structure 310b, the layers of first spacer material 322a, 322b, 324a, and 324b, and the second layer of dielectric material 304 may also be removed, these remaining portions are still named and labeled as they were before the removal of the top portions thereof for clarity.

In some aspects, the top portion of the semiconductor structure 300D, including the hard mask 314a and the hard mask 314b, may be removed based on a chemical-mechanical polishing (CMP) process. In some aspects, other removal or planarization processes may be used to remove the hard mask 314a and the hard mask 314b.

Figure 3F:
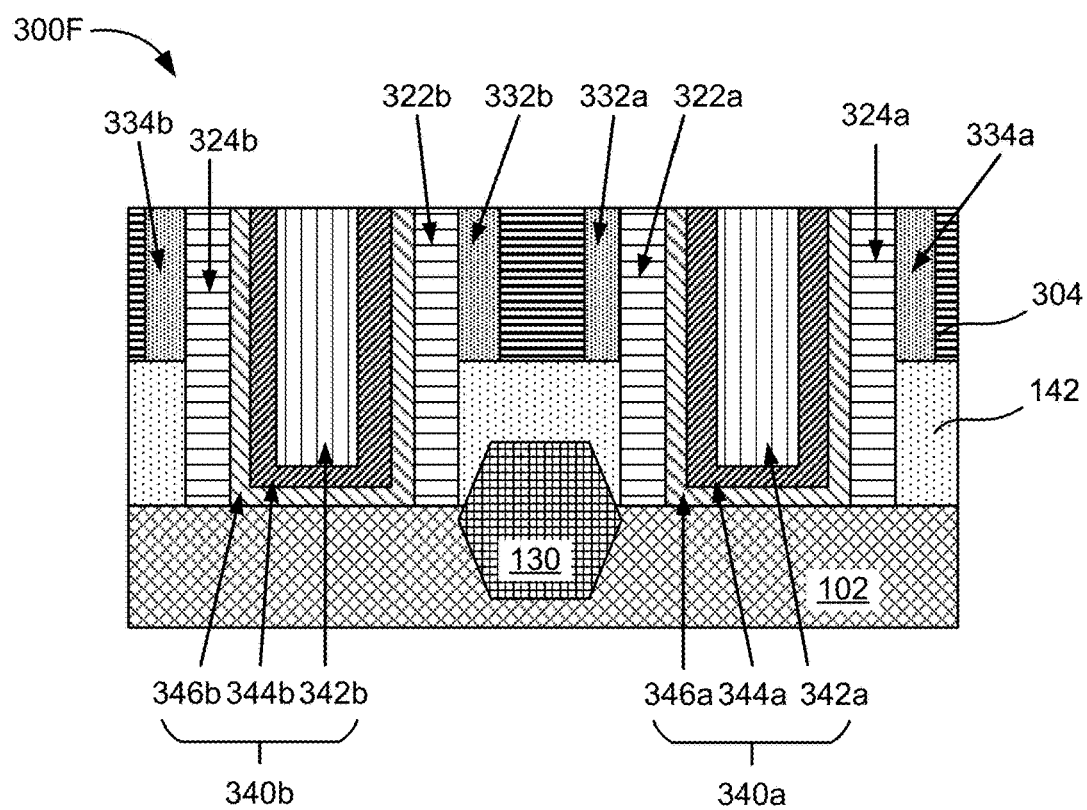

As shown in FIG. 3F, a semiconductor structure 300F is formed based on the semiconductor structure 300E, by replacing the intermediate gate structures 310a and 310b with different intermediate gate structures 340a and 340b, respectively. In some aspects, the polysilicon gates 312a and 312b are removed by an etching process, such as a wet etching process. In some aspects, layers of materials are formed in the openings where the polysilicon gates 312a and 312b were. In some aspects, the intermediate gate structures 340a and 340b may have different structures and different materials.

In some aspects, the intermediate gate structure 340a may be formed by depositing a layer of gate dielectric material 346a by CVD or PVD, followed by depositing a layer of gate metal material 344a by CVD or PVD, and then forming a conductive filling 342a by CVD or PVD. In some aspects, one or more polishing processes may be performed after one or more deposition processes in order to remove excess materials on the layers of first spacer material 322a, 322b, 324a, and 324b and the second layer of dielectric material 304.

In some aspects, the layer of gate dielectric material 346a may have a relative dielectric constant greater than that of that of $SiO_2$. In some aspects, the conductive filling 342a may include tungsten, copper, or silicide. In some aspects, the layer of gate metal material 344a may include TiAlN, TiAl, TiN, or any materials for suitable work function settings. In some aspects, the layer of gate dielectric material 346a may include $HfO_2$.

In some aspects, the intermediate gate structure 340b may be formed by depositing a layer of gate dielectric material 346b by CVD or PVD, followed by depositing a layer of gate metal material 344b by CVD or PVD, and then forming a conductive filling 342b by CVD or PVD. In some aspects, one or more polishing processes may be performed after one or more deposition processes in order to remove excess materials on the layers of first spacer material 322a, 322b, 324a, and 324b and the second layer of dielectric material 304.

In some aspects, the layer of gate dielectric material 346b may have a relative dielectric constant greater than that of that of $SiO_2$. In some aspects, the conductive filling 342b may include tungsten, copper, or silicide. In some aspects, the layer of gate metal material 344b may include TiAlN, TiAl, TiN, or any materials for suitable work function settings. In some aspects, the layer of gate dielectric material 346b may include $HfO_2$.

In some aspects, the formation of the intermediate gate structures 340a and 340b may include temporarily covering one of the gate structures, such that the intermediate gate structures 340a and 340b may be formed to have different materials and/or structures may be formed.

Figure 3G:
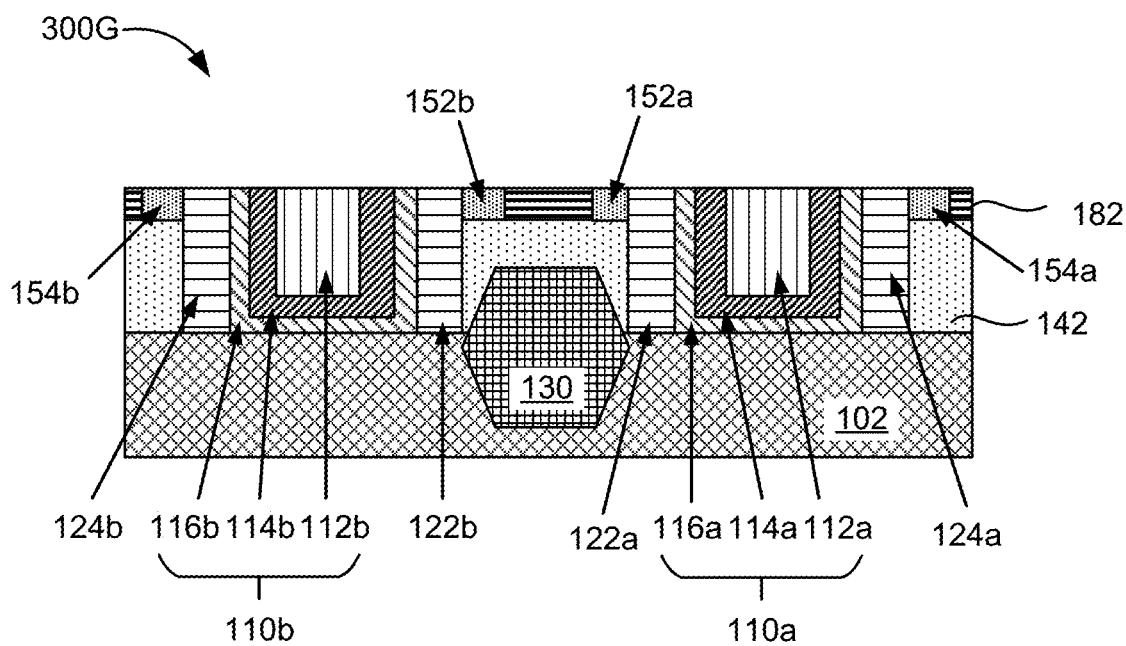

As shown in FIG. 3G, a semiconductor structure 300G is formed based on the semiconductor structure 300F, by removing an upper portion of the semiconductor structure 300F. For example, the upper portions of the layers of first spacer material 322a, 322b, 324a, and 324b are removed to form gate spacers 122a, 122b, 124a, and 124b, respectively. The upper portions of the layers of the second spacer material 332a, 332b, 334a, and 334b are removed to form etch stop spacers 152a, 152b, 154a, and 154b, respectively. An upper portion of the second layer of dielectric material 304 is removed to form a second dielectric layer 182. Also, the upper portions of the intermediate gate structures 340a and 340b are removed to form gate structures 110a and 110b, respectively. For the gate structure 110a, the conductive filling 342a, the layer of gate metal material 344a, and the layer of gate dielectric material 346a become a conductive structure 112a, a gate metal layer 114a, and a gate dielectric layer 116a thereof. For the gate structure 110b, the conductive filling 342b, the layer of gate metal material 344b, and the layer of gate dielectric material 346b become a conductive structure 112b, a gate metal layer 114b, and a gate dielectric layer 116b thereof.

In some aspects, the upper portion of the semiconductor structure 300F may be removed based on a CMP process. In some aspects, other removal or planarization processes may be used to remove the upper portion of the semiconductor structure 300F. In some aspects, a height of the etch stop spacers 152a, 152b, 154a, and 154b may range from 1 nm to 5 nm.

Figure 3H:
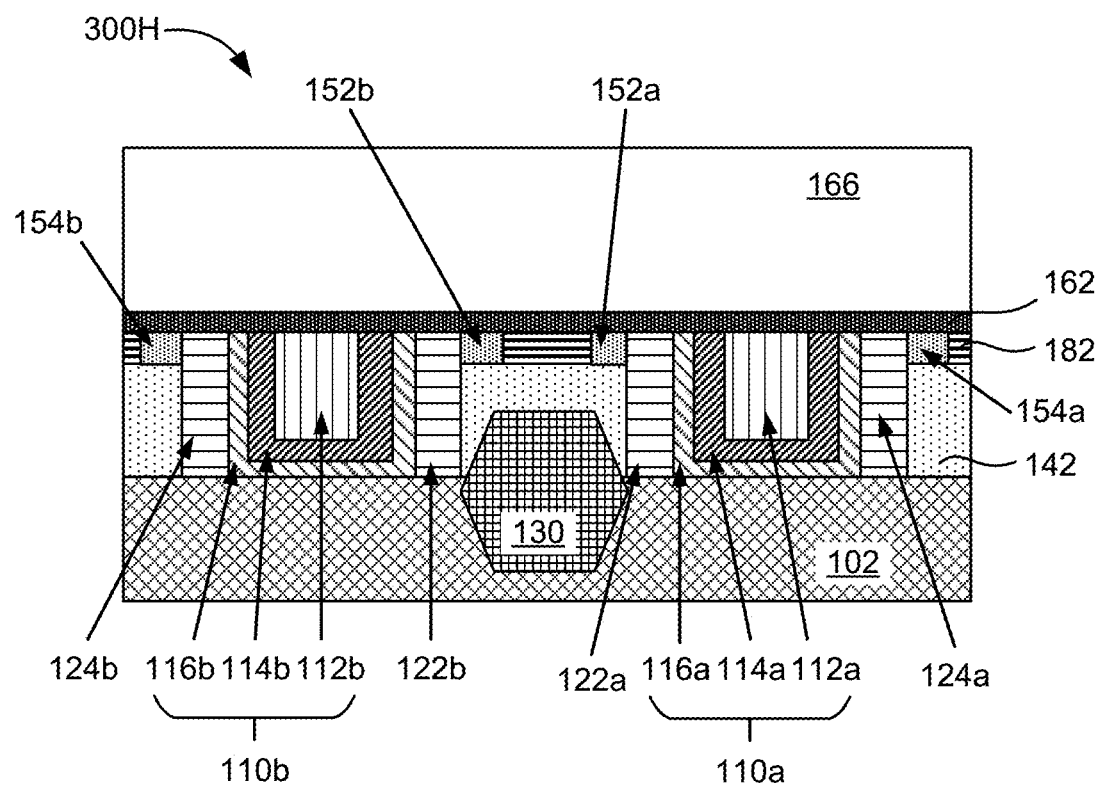

As shown in FIG. 3H, a semiconductor structure 300H is formed based on the semiconductor structure 300G, by forming an etch stop layer 162 over the semiconductor structure 300G and forming a third dielectric layer 166 over the etch stop layer 162. In some aspects, the etch stop layer 162 may be over and adjoining an upper surface of the gate structures 110a and 110b, an upper surface of the gate spacers 122*a*, 122*b*, 124*a*, and 124*b*, the upper surface of the etch stop spacers 152*a*, 152*b*, 154*a*, and 154*b*, and an upper surface of the second dielectric layer 182.

In some aspects, the etch stop layer 162 may be formed by CVD or PVD. In some aspects, the etch stop layer 162 may include silicon nitride, silicon carbide, or a combination thereof. In some aspects, the third dielectric layer 166 be formed by CVD or PVD. In some aspects, the third dielectric layer 166 may include $SiO_2$.

Figure 3I:
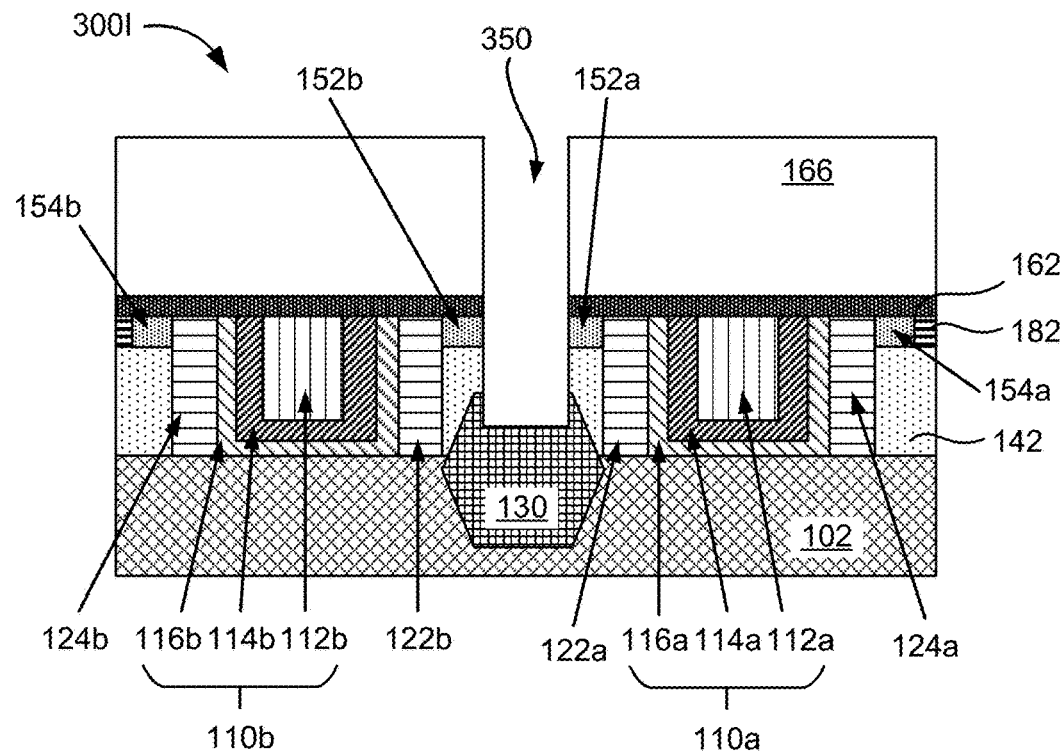

As shown in FIG. 3I, a semiconductor structure 300I is formed based on the semiconductor structure 300H, by forming an opening 350 in the semiconductor structure 300H. In some aspects, the opening 350 extends through at least the etch stop layer 162 and the first dielectric layer 142, and exposes the source/drain structure 130. In some aspects, the opening 350 also extends through the second dielectric layer 182 and the third dielectric layer 166. In some aspects, a sidewall of the etch stop layer 162 and a sidewall of the etch stop spacer 152*a* define a portion of a sidewall of the opening 350. In some aspects, another sidewall of the etch stop layer 162 and a sidewall of the etch stop spacer 152*b* define a portion of another sidewall of the opening 350.

In some aspects, the opening 350 may be formed by first forming and patterning another masking layer over the third dielectric layer 166, on which a first etching process may be performed to remove a portion of the third dielectric layer 166 and a portion of the etch stop layer 162 to form an upper portion of the opening 350. In some aspects, after forming the upper portion of the opening 350, a second etching process may be performed to extend the opening 350 to reach the source/drain structure 130. In some aspects, a portion of the source/drain structure 130 may be removed during the second etching process.

In some aspects, the first etching process may be a wet etching process or a dry etching process. In some aspects, the second etching process may be a wet etching process or a dry etching process. In some aspects, the etch stop spacers 152*a* and 152*b* may include a material that has a sufficient selectivity towards the first dielectric layer 142 during the second etching process. Accordingly, in some aspects, the size and position of the lower portion of the opening 350 below the etch stop spacers 152*a* and 152*b* may be restricted by the etch stop spacers 152*a* and 152*b*.

Figure 3J:
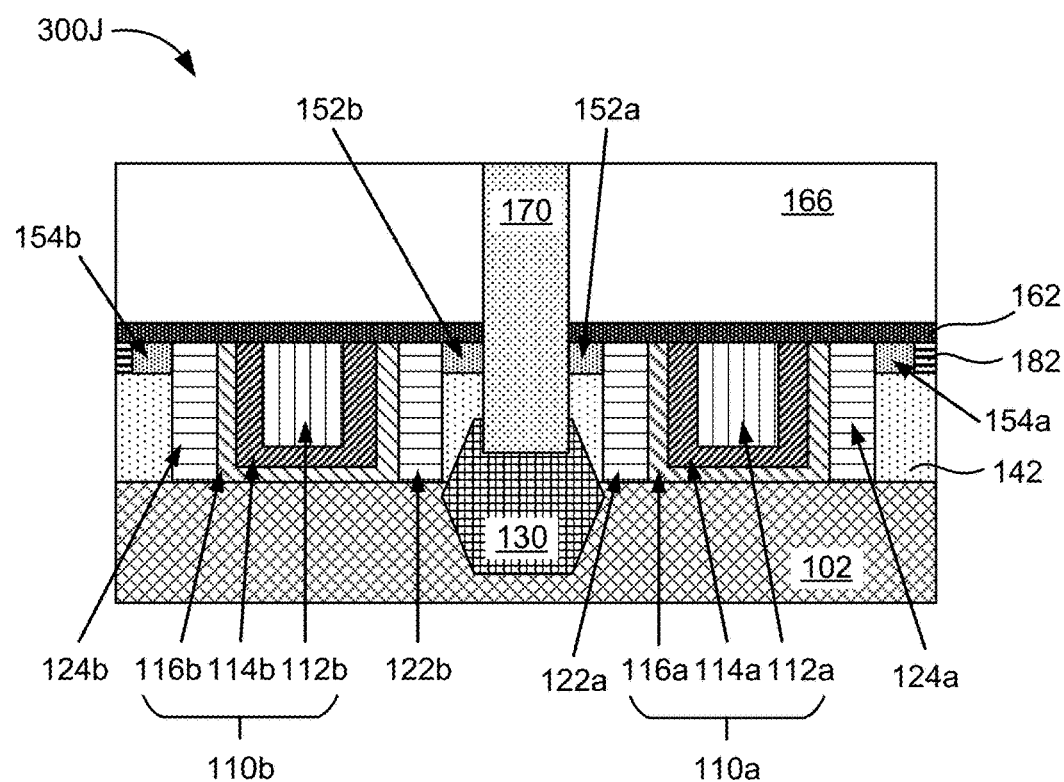

As shown in FIG. 3J, a semiconductor structure 300J is formed based on the semiconductor structure 300I, by filling the opening 350 with a conductive material to form a source/drain contact 170. In some aspects, the semiconductor structure 300J may correspond to the semiconductor structure 100 in FIG. 1. In some aspects, the source/drain contact 170 may include cobalt, tungsten, or both. In some aspects, the source/drain contact 170 may formed by CVD or PVD, followed by a polishing process (e.g., a CMP process) to remove excessive portion of the materials over the third dielectric layer 166.

FIG. 4 illustrates a method 400 for manufacturing a semiconductor structure (such as the semiconductor structure 100 or the semiconductor structure 300J), according to aspects of the disclosure.

At operation 410, an opening (e.g., the opening 350) is formed in an intermediate structure (e.g., the semiconductor structure 300H). In some aspects, the opening may be formed based on one or more etching processes.

In some aspects, the intermediate structure may include a substrate (e.g., the substrate 102); a gate structure (e.g., the gate structure 110*a*, 110*b*) disposed on the substrate, a gate spacer (e.g., the gate spacer 122*a*) over the substrate and adjacent to a sidewall of the gate structure, a source/drain structure (e.g., the source/drain structure 130) over the substrate and adjacent to the first spacer, a first dielectric layer (e.g., the first dielectric layer 142) disposed on the substrate and the source/drain structure, an etch stop spacer (e.g., the etch stop spacer 152*a*) over the first dielectric layer and adjacent to the first spacer, and an etch stop layer (e.g., the etch stop layer 162) over and adjoining an upper surface of the gate structure, an upper surface of the first spacer, and an upper surface of the etch stop spacer. In some aspects, the opening may extend through at least the etch stop layer and the first dielectric layer, and exposes the source/drain structure. In some aspects, a sidewall of the etch stop layer and a sidewall of the etch stop spacer may define at least a portion of a sidewall of the opening.

In some aspects, the etch stop spacer comprises silicon nitride, aluminum oxide, aluminum nitride, or a combination thereof. In some aspects, a width of the etch stop spacer ranges from 1 nm to 5 nm.

At operation 420, a source/drain contact (e.g., the source/drain contact 170) is formed in the opening (e.g., the opening 350). In some aspects, the source/drain contact may be formed based on a CVD process or a PVD process. In some aspects, the source/drain contact may include cobalt, tungsten, or both.

In some aspects, the source/drain contact extending through the etch stop layer and the first dielectric layer and in contact with the source/drain structure, and a sidewall of the source/drain contact adjoining the sidewall of the etch stop layer and the sidewall of the etch stop spacer.

As will be appreciated, a technical advantage of the method 400 is to restrict the position and size of a source/drain contact based on the etch stop spacers adjacent to gate spacers. The etch stop spacers allow the formation of the opening, in which the source/drain contact is to be formed, to be "self-aligned," such that the source/drain contact may reach a desirable CD and may be kept sufficiently away from the nearby gate structure for a lower parasitic capacitance and for avoidance of the contact-to-gate short. Therefore, the precision requirement for the patterning process for the opening and/or the complexity of the manufacturing process thereof may be relaxed.

Figure 5:
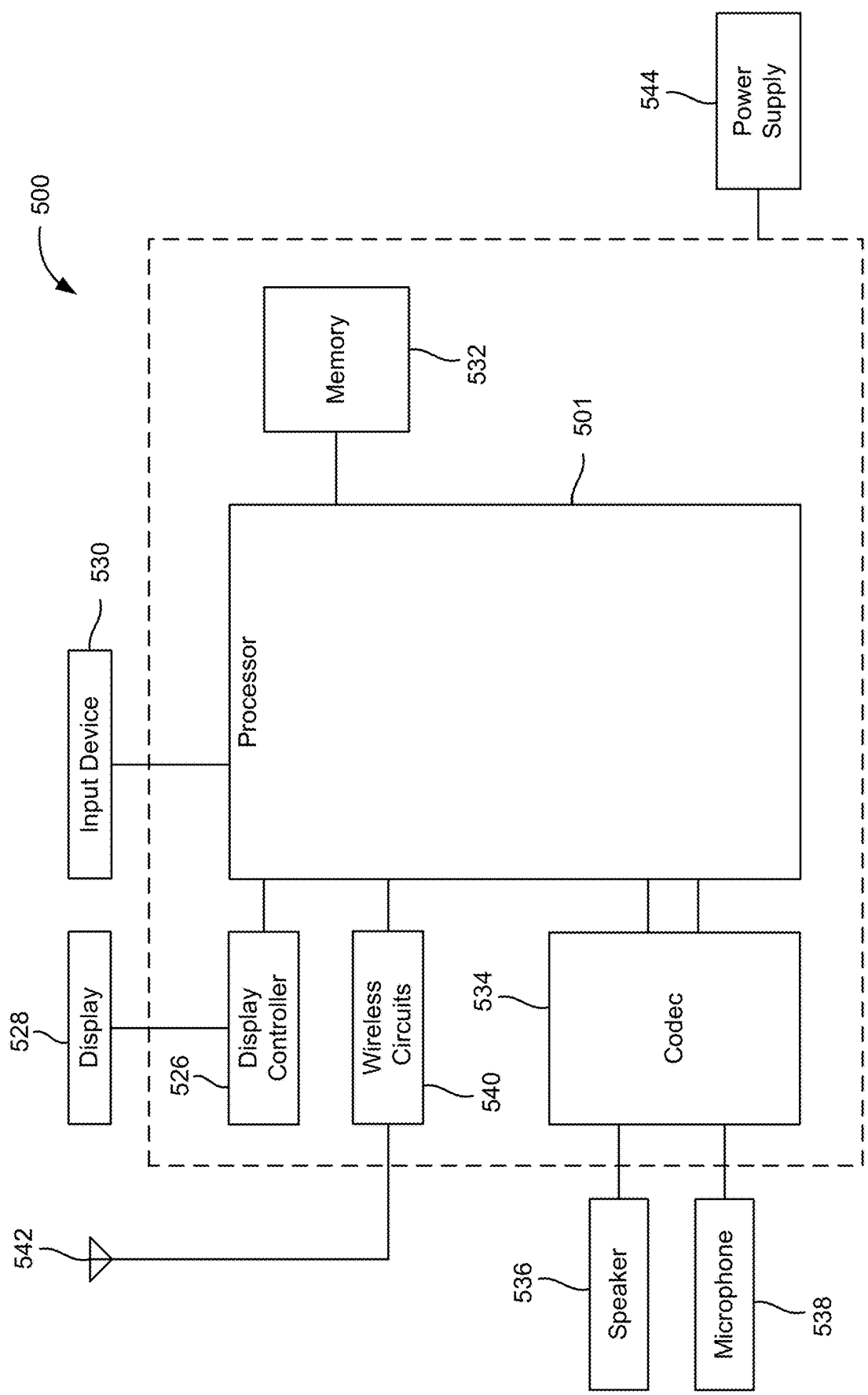
FIG. 5 illustrates a mobile device example, according to aspects of the disclosure.

FIG. 5 illustrates a mobile device 500, according to aspects of the disclosure. In some aspects, the mobile device 500 may be implemented by including one or more ICs including semiconductor structures manufactured based on the examples described in this disclosure.

In some aspects, mobile device 500 may be configured as a wireless communication device. As shown, mobile device 500 includes processor 501. Processor 501 may be communicatively coupled to memory 532 over a link, which may be a die-to-die or chip-to-chip link. Mobile device 500 also includes display 528 and display controller 526, with display controller 526 coupled to processor 501 and to display 528. The mobile device 500 may include input device 530 (e.g., physical, or virtual keyboard), power supply 544 (e.g., battery), speaker 536, microphone 538, and wireless antenna 542. In some aspects, the power supply 544 may directly or indirectly provide the supply voltage for operating some or all of the components of the mobile device 500.

In some aspects, FIG. 5 may include coder/decoder (CODEC) 534 (e.g., an audio and/or voice CODEC) coupled to processor 501; speaker 536 and microphone 538 coupled to CODEC 534; and wireless circuits 540 (which may include a modem, RF circuitry, filters, etc.) coupled to wireless antenna 542 and to processor 501.

In some aspects, one or more of processor 501, display controller 526, memory 532, CODEC 534, and wireless circuits 540 may include one or more ICs including semiconductor structures manufactured according to the examples described in this disclosure.

It should be noted that although FIG. 5 depicts a mobile device 500, similar architecture may be used to implement an apparatus including a set top box, a music player, a video player, an entertainment unit, a navigation device, a personal digital assistant (PDA), a fixed location data unit, a computer, a laptop, a tablet, a communications device, a mobile phone, or other similar devices.

Figure 6:
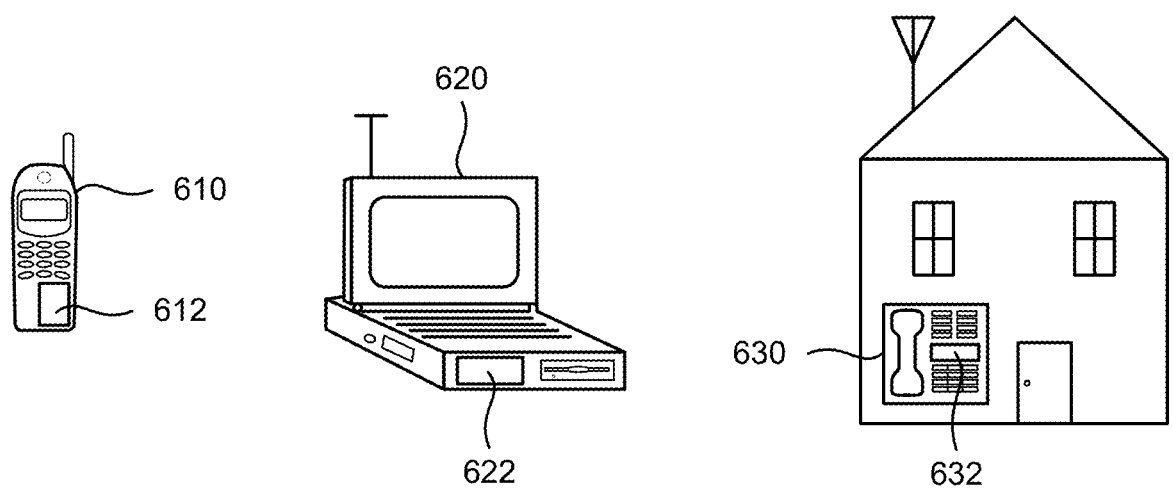
FIG. 6 illustrates various electronic devices that may be integrated with ICs, according to aspects of the disclosure.

FIG. 6 illustrates various electronic devices 610, 620, and 630 that may be integrated with ICs 612, 622, and 632, according to aspects of the disclosure. For example, a mobile phone device 610, a laptop computer device 620, and a fixed location terminal device 630 may each be considered generally user equipment (UE) and may include one or more ICs, such as ICs 612, 622, and 632, and a power supply to provide the supply voltages to power the ICs. The ICs 612, 622, and 632 may be, for example, correspond to an IC including semiconductor structures manufactured based on the examples described above with reference to FIGS. 1, 2A-2C, and 3A-3J.

The devices 610, 620, and 630 illustrated in FIG. 6 are merely non-limiting examples. Other electronic devices may also feature the ICs including semiconductor structures as described in this disclosure, including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device, an access point, a base station, or any other device that stores or retrieves data or computer instructions or any combination thereof.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-6 may be rearranged and/or combined into a single component, process, feature, or function or incorporated in several components, processes, or functions. Additional elements, components, processes, and/or functions may also be added without departing from the disclosure. In some implementations, FIGS. 1-6 and the corresponding description may be used to manufacture, create, provide, and/or produce integrated devices. In some implementations, a device may include a die, an integrated device, a die package, an IC, a device package, an IC package, a wafer, a semiconductor device, a system in package (SiP), a system on chip (SoC), a package on package (PoP) device, and the like.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. UEs can be embodied by any of a number of types of devices including but not limited to printed circuit (PC) cards, compact flash devices, external or internal modems, wireless or wireline phones, smartphones, tablets, consumer tracking devices, asset tags, and so on.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart).

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer, or an electronic circuit. In some examples, some or a plurality of the most important method actions can be performed by such an apparatus.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. A semiconductor structure, comprising: a gate structure disposed on a substrate; a gate spacer adjacent to a sidewall of the gate structure; a source/drain structure adjacent to the gate spacer; a first dielectric layer disposed on the substrate and the source/drain structure; an etch stop spacer over the first dielectric layer and adjacent to the gate spacer; an etch stop layer over and adjoining an upper surface of the gate structure, an upper surface of the gate spacer, and an upper surface of the etch stop spacer; and a source/drain contact extending through the etch stop layer and the first dielectric layer and in contact with the source/drain structure, a sidewall of the source/drain contact adjoining a sidewall of the etch stop layer and a sidewall of the etch stop spacer.

Clause 2. The semiconductor structure of clause 1, wherein the etch stop spacer comprises silicon nitride, aluminum oxide, aluminum nitride, or a combination thereof.

Clause 3. The semiconductor structure of any of clauses 1 to 2, wherein a width of the etch stop spacer ranges from 1 nm to 5 nm.

Clause 4. The semiconductor structure of any of clauses 1 to 3, further comprising: a second gate structure disposed on the substrate; a second gate spacer adjacent to a sidewall of the second gate structure; and a second etch stop spacer over the first dielectric layer and adjacent to the second gate spacer, wherein: the source/drain contact is disposed between the etch stop spacer and the second etch stop spacer, and a second sidewall of the source/drain contact adjoining a sidewall of the second etch stop spacer.

Clause 5. The semiconductor structure of clause 4, wherein a width of the etch stop spacer is same as a width of the second etch stop spacer.

Clause 6. The semiconductor structure of any of clauses 1 to 5, further comprising a second dielectric layer over the first dielectric layer, the etch stop layer being over and adjoining an upper surface of the second dielectric layer.

Clause 7. The semiconductor structure of clause 6, wherein the second dielectric layer comprises $SiO_2$.

Clause 8. The semiconductor structure of any of clauses 1 to 7, further comprising a third dielectric layer over the etch stop layer, wherein the source/drain contact extends through the third dielectric layer.

Clause 9. The semiconductor structure of clause 8, wherein a width of a portion of the source/drain contact below the etch stop spacer is no greater than a width of a portion of the source/drain contact above the etch stop spacer.

Clause 10. The semiconductor structure of clause 9, wherein: the width of the portion of the source/drain contact below the etch stop spacer ranges from 5 nm to 15 nm, and the width of the portion of the source/drain contact above the etch stop spacer ranges from 10 nm to 20 nm.

Clause 11. The semiconductor structure of any of clauses 1 to 10, wherein the gate spacer has a relative dielectric constant not greater than that of $SiO_2$.

Clause 12. The semiconductor structure of any of clauses 1 to 11, wherein the first dielectric layer has a relative dielectric constant not greater than that of $SiO_2$.

Clause 13. The semiconductor structure of any of clauses 1 to 12, wherein the gate spacer comprises SiBCN.

Clause 14. The semiconductor structure of any of clauses 1 to 13, wherein the first dielectric layer comprises SiCOH or $SiO_2$.

Clause 15. The semiconductor structure of any of clauses 1 to 14, wherein the source/drain contact comprises cobalt, tungsten, or both.

Clause 16. A method of manufacturing a semiconductor structure, comprising: forming an opening in an intermediate structure, wherein the intermediate structure includes: a substrate; a gate structure disposed on the substrate; a gate spacer adjacent to a sidewall of the gate structure; a source/drain structure adjacent to the gate spacer; a first dielectric layer disposed on the substrate and the source/drain structure; an etch stop spacer over the first dielectric layer and adjacent to the gate spacer; and an etch stop layer over and adjoining an upper surface of the gate structure, an upper surface of the gate spacer, and an upper surface of the etch stop spacer, wherein the opening extends through at least the etch stop layer and the first dielectric layer, and exposes the source/drain structure, and wherein a sidewall of the etch stop layer and a sidewall of the etch stop spacer defining at least a portion of a sidewall of the opening; and forming a source/drain contact in the opening, the source/drain contact extending through the etch stop layer and the first dielectric layer and in contact with the source/drain structure, and a sidewall of the source/drain contact adjoining the sidewall of the etch stop layer and the sidewall of the etch stop spacer.

Clause 17. The method of clause 16, further comprising forming the intermediate structure, which comprises: forming a layer of first spacer material on a sidewall of a first intermediate gate structure, the first intermediate gate structure being over the substrate; forming a layer of second spacer material on at least a portion of a sidewall of the layer of first spacer material; replacing the first intermediate gate structure with a second intermediate gate structure; and removing an upper portion of the layer of first spacer material, an upper portion of the layer of second spacer material, and an upper portion of the second intermediate gate structure to form the gate spacer, the etch stop spacer, and the gate structure, respectively.

Clause 18. The method of clause 17, wherein the removing is performed based on a chemical-mechanical polishing (CMP) process.

Clause 19. The method of any of clauses 17 to 18, wherein the forming the intermediate structure further comprises: forming the source/drain structure over the substrate and adjacent to the layer of first spacer material prior to the forming the layer of second spacer material, the layer of second spacer material being directly over a first portion of the source/drain structure; forming the first dielectric layer over the substrate and the source/drain structure prior to the forming the layer of second spacer material; and forming a layer of dielectric material over the first dielectric layer, a portion of the layer of dielectric material being adjacent to a sidewall of the layer of second spacer material and directly over a second portion of the source/drain structure.

Clause 20. The method of clause 19, wherein the forming the intermediate structure further comprises: removing an upper portion of the layer of dielectric material to form a second dielectric layer; and forming the etch stop layer over and adjoining the upper surface of the gate structure, the upper surface of the gate spacer, the upper surface of the etch stop spacer, and an upper surface of the second dielectric layer.

Clause 21. The method of any of clauses 16 to 20, wherein the forming the source/drain contact in the opening comprises: filling the opening with a material comprising cobalt, tungsten, or both; and performing a chemical-mechanical polishing (CMP) process to remove an excessive portion of the material.

Clause 22. The method of clause 21, wherein a width of a portion of the source/drain contact below the etch stop spacer is no greater than a width of a portion of the source/drain contact above the etch stop spacer.

Clause 23. The method of clause 22, wherein: the width of the portion of the source/drain contact below the etch stop spacer ranges from 5 nm to 15 nm, and the width of the portion of the source/drain contact above the etch stop spacer ranges from 10 nm to 20 nm.

Clause 24. The method of any of clauses 16 to 23, wherein the etch stop spacer comprises silicon nitride, aluminum oxide, aluminum nitride, or a combination thereof.

Clause 25. The method of any of clauses 16 to 24, wherein a width of the etch stop spacer ranges from 1 nm to 5 nm.

Clause 26. The method of any of clauses 16 to 25, wherein the gate spacer has a relative dielectric constant not greater than that of $SiO_2$.

Clause 27. The method of any of clauses 16 to 26, wherein the first dielectric layer has a relative dielectric constant not greater than that of $SiO_2$.

Clause 28. The method of any of clauses 16 to 27, wherein the gate spacer comprises SiBCN.

Clause 29. The method of any of clauses 16 to 28, wherein the first dielectric layer comprises SiCOH or $SiO_2$.

Clause 30. The method of any of clauses 16 to 29, wherein: the intermediate structure further includes: a second gate structure disposed on the substrate; a second gate spacer adjacent to a sidewall of the second gate structure; and a second etch stop spacer over the first dielectric layer and adjacent to the second gate spacer, the source/drain contact is disposed between the etch stop spacer and the second etch stop spacer, and a second sidewall of the source/drain contact adjoining a sidewall of the second etch stop spacer.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a DSP, an ASIC, an FPGA, or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A semiconductor structure, comprising:
   a gate structure disposed on a substrate;
   a gate spacer adjacent to a sidewall of the gate structure;
   a source/drain structure adjacent to the gate spacer;
   a first dielectric layer disposed on the substrate and the source/drain structure;
   an etch stop spacer over the first dielectric layer and adjacent to the gate spacer;
   an etch stop layer over and adjoining an upper surface of the gate structure, an upper surface of the gate spacer, and an upper surface of the etch stop spacer; and
   a source/drain contact extending through the etch stop layer and the first dielectric layer and in contact with the source/drain structure, a sidewall of the source/drain contact adjoining a sidewall of the etch stop layer and a sidewall of the etch stop spacer.

2. The semiconductor structure of claim 1, wherein the etch stop spacer comprises silicon nitride, aluminum oxide, aluminum nitride, or a combination thereof.

3. The semiconductor structure of claim 1, wherein a width of the etch stop spacer ranges from 1 nm to 5 nm.

4. The semiconductor structure of claim 1, further comprising:
   a second gate structure disposed on the substrate;
   a second gate spacer adjacent to a sidewall of the second gate structure; and
   a second etch stop spacer over the first dielectric layer and adjacent to the second gate spacer,
   wherein:
   the source/drain contact is disposed between the etch stop spacer and the second etch stop spacer, and
   a second sidewall of the source/drain contact adjoining a sidewall of the second etch stop spacer.

5. The semiconductor structure of claim 4, wherein a width of the etch stop spacer is same as a width of the second etch stop spacer.

6. The semiconductor structure of claim 1, further comprising a second dielectric layer over the first dielectric layer, the etch stop layer being over and adjoining an upper surface of the second dielectric layer.

7. The semiconductor structure of claim 6, wherein the second dielectric layer comprises $SiO_2$.

8. The semiconductor structure of claim 1, further comprising a third dielectric layer over the etch stop layer, wherein the source/drain contact extends through the third dielectric layer.

9. The semiconductor structure of claim 8, wherein a width of a portion of the source/drain contact below the etch stop spacer is no greater than a width of a portion of the source/drain contact above the etch stop spacer.

10. The semiconductor structure of claim 9, wherein:
    the width of the portion of the source/drain contact below the etch stop spacer ranges from 5 nm to 15 nm, and
    the width of the portion of the source/drain contact above the etch stop spacer ranges from 10 nm to 20 nm.

11. The semiconductor structure of claim 1, wherein the gate spacer has a relative dielectric constant not greater than that of $SiO_2$.

12. The semiconductor structure of claim 1, wherein the first dielectric layer has a relative dielectric constant not greater than that of $SiO_2$.

13. The semiconductor structure of claim 1, wherein the gate spacer comprises SiBCN.

14. The semiconductor structure of claim 1, wherein the first dielectric layer comprises SiCOH or $SiO_2$.

15. The semiconductor structure of claim 1, wherein the source/drain contact comprises cobalt, tungsten, or both.

16. A method of manufacturing a semiconductor structure, comprising:
    forming an opening in an intermediate structure,
    wherein the intermediate structure includes:
      a substrate;
      a gate structure disposed on the substrate;
      a gate spacer adjacent to a sidewall of the gate structure;
      a source/drain structure adjacent to the gate spacer;
      a first dielectric layer disposed on the substrate and the source/drain structure;
      an etch stop spacer over the first dielectric layer and adjacent to the gate spacer; and
      an etch stop layer over and adjoining an upper surface of the gate structure, an upper surface of the gate spacer, and an upper surface of the etch stop spacer,
    wherein the opening extends through at least the etch stop layer and the first dielectric layer, and exposes the source/drain structure, and
    wherein a sidewall of the etch stop layer and a sidewall of the etch stop spacer defining at least a portion of a sidewall of the opening; and forming a source/drain contact in the opening, the source/drain contact extending through the etch stop layer and the first dielectric layer and in contact with the source/drain structure, and a sidewall of the source/drain contact adjoining the sidewall of the etch stop layer and the sidewall of the etch stop spacer.

17. The method of claim 16, further comprising forming the intermediate structure, which comprises:
forming a layer of first spacer material on a sidewall of a first intermediate gate structure, the first intermediate gate structure being over the substrate;
forming a layer of second spacer material on at least a portion of a sidewall of the layer of first spacer material;
replacing the first intermediate gate structure with a second intermediate gate structure; and
removing an upper portion of the layer of first spacer material, an upper portion of the layer of second spacer material, and an upper portion of the second intermediate gate structure to form the gate spacer, the etch stop spacer, and the gate structure, respectively.

18. The method of claim 17, wherein the removing is performed based on a chemical-mechanical polishing (CMP) process.

19. The method of claim 17, wherein the forming the intermediate structure further comprises:
forming the source/drain structure over the substrate and adjacent to the layer of first spacer material prior to the forming the layer of second spacer material, the layer of second spacer material being directly over a first portion of the source/drain structure;
forming the first dielectric layer over the substrate and the source/drain structure prior to the forming the layer of second spacer material; and
forming a layer of dielectric material over the first dielectric layer, a portion of the layer of dielectric material being adjacent to a sidewall of the layer of second spacer material and directly over a second portion of the source/drain structure.

20. The method of claim 19, wherein the forming the intermediate structure further comprises:
removing an upper portion of the layer of dielectric material to form a second dielectric layer; and
forming the etch stop layer over and adjoining the upper surface of the gate structure, the upper surface of the gate spacer, the upper surface of the etch stop spacer, and an upper surface of the second dielectric layer.

21. The method of claim 16, wherein the forming the source/drain contact in the opening comprises:
filling the opening with a material comprising cobalt, tungsten, or both; and
performing a chemical-mechanical polishing (CMP) process to remove an excessive portion of the material.

22. The method of claim 21, wherein a width of a portion of the source/drain contact below the etch stop spacer is no greater than a width of a portion of the source/drain contact above the etch stop spacer.

23. The method of claim 22, wherein:
the width of the portion of the source/drain contact below the etch stop spacer ranges from 5 nm to 15 nm, and
the width of the portion of the source/drain contact above the etch stop spacer ranges from 10 nm to 20 nm.

24. The method of claim 16, wherein the etch stop spacer comprises silicon nitride, aluminum oxide, aluminum nitride, or a combination thereof.

25. The method of claim 16, wherein a width of the etch stop spacer ranges from 1 nm to 5 nm.

26. The method of claim 16, wherein the gate spacer has a relative dielectric constant not greater than that of $SiO_2$.

27. The method of claim 16, wherein the first dielectric layer has a relative dielectric constant not greater than that of $SiO_2$.

28. The method of claim 16, wherein the gate spacer comprises SiBCN.

29. The method of claim 16, wherein the first dielectric layer comprises SiCOH or $SiO_2$.

30. The method of claim 16, wherein:
the intermediate structure further includes:
a second gate structure disposed on the substrate;
a second gate spacer adjacent to a sidewall of the second gate structure; and
a second etch stop spacer over the first dielectric layer and adjacent to the second gate spacer,
the source/drain contact is disposed between the etch stop spacer and the second etch stop spacer, and
a second sidewall of the source/drain contact adjoining a sidewall of the second etch stop spacer.

* * * * *